(12) United States Patent
Lee et al.

(10) Patent No.: US 12,517,435 B2
(45) Date of Patent: Jan. 6, 2026

(54) METHOD FOR SPIN-COATING A LAYER ON A SEMICONDUCTOR WAFER

(71) Applicant: Taiwan Semiconductor Manufacturing Company, LTD., Hsinchu (TW)

(72) Inventors: Yung-Yao Lee, Zhubei (TW); Yung-Hsiang Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 779 days.

(21) Appl. No.: 17/578,778

(22) Filed: Jan. 19, 2022

(65) Prior Publication Data
US 2023/0229085 A1   Jul. 20, 2023

(51) Int. Cl.
*G03F 7/16* (2006.01)
*C09D 179/08* (2006.01)
*H01L 21/02* (2006.01)

(52) U.S. Cl.
CPC ........... *G03F 7/162* (2013.01); *C09D 179/08* (2013.01); *H01L 21/02118* (2013.01); *H01L 21/02282* (2013.01)

(58) Field of Classification Search
CPC . G03F 7/162; C09D 179/08; H01L 21/02282; H01L 21/6838; H01L 21/02118; H01L 21/6715
See application file for complete search history.

(56) References Cited

U.S. PATENT DOCUMENTS

| | | | | |
|---|---|---|---|---|
| 6,001,418 A | * | 12/1999 | DeSimone | B05D 1/005 427/162 |
| 10,734,252 B2 | * | 8/2020 | Nakai | H01L 21/68728 |
| 2002/0127334 A1 | * | 9/2002 | Gurer | B05C 5/0208 427/346 |
| 2009/0258139 A1 | * | 10/2009 | Shite | H01L 21/67017 118/52 |

(Continued)

FOREIGN PATENT DOCUMENTS

| | | |
|---|---|---|
| CN | 110444490 A | 11/2019 |
| CN | 110955116 A | 4/2020 |

(Continued)

OTHER PUBLICATIONS

Chinese Notice of Allowance for Application No. 202210294601.2 Dated Oct. 22, 2025.

*Primary Examiner* — Khiem D Nguyen
(74) *Attorney, Agent, or Firm* — Lippes Mathias LLP (57) ABSTRACT

A method and corresponding spin coater is provided for forming a layer of uniform thickness on a semiconductor wafer having a central region and an outer edge. The method includes: depositing a flowable coating material on the semiconductor wafer at the central region, the layer being formed from the coating material; rotating the semiconductor wafer about an axis such that a centrifugal force urges coating material to spread from the central region toward the outer edge of the semiconductor wafer; and creating a pressure differential in one or more regions proximate to the outer edge of the semiconductor wafer. The pressure differential may be created by a wall with pins holes, the wall at least partially encircling the outer edge of the semiconductor wafer.

20 Claims, 4 Drawing Sheets

(56) References Cited

U.S. PATENT DOCUMENTS

| | | | | |
|---|---|---|---|---|
| 2014/0261163 | A1* | 9/2014 | Kishita | ............. H01L 21/68714 |
| | | | | 118/52 |
| 2015/0251211 | A1* | 9/2015 | Tachibana | ........... H01L 21/6715 |
| | | | | 118/704 |
| 2020/0103768 | A1* | 4/2020 | Hsieh | ................... H01L 21/6715 |
| 2020/0266049 | A1* | 8/2020 | Truong | ............. H01L 21/67051 |

FOREIGN PATENT DOCUMENTS

| | | |
|---|---|---|
| TW | 202001981 A | 1/2020 |
| TW | 202013092 A | 4/2020 |

\* cited by examiner

METHOD FOR SPIN-COATING A LAYER ON A SEMICONDUCTOR WAFER

BACKGROUND

The following relates to the semiconductor arts, and in particular, to a method and apparatus for promoting thickness uniformity in a spin-coated layer during the semiconductor manufacturing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, the semiconductor manufacturing process involves many process steps in which various layers of material are build-up one upon one another and patterned accordingly. Commonly, some of these layers, for example, such as a photoresist layer or polyimide layer, may be formed by a so-called spin-coating process, in which a fluid or otherwise flowable material is deposited atop a semiconductor wafer in a central region thereof. In practice, the semiconductor wafer is suitably spun or rotated, for example, about its central axis, and the centrifugal force causes the deposited material to spread and/or flow outward from the central region where it is initially deposited toward the outer periphery or edge of the semiconductor wafer. With traditional spin-coating techniques and/or devices, there is the risk that the thickness of the spin-coated layer may not end up being substantially uniform in thickness at the conclusion, for example, being somewhat thinner at or near the outer periphery or edge of the semiconductor wafer as compared to the central region where the layer material is initially deposited. One advantage of the method and/or spin coater disclosed herein is that it promotes thickness uniformity in the spin-coated layer.

As recognized herein, a source of reduced thickness of the spun-on layer proximate to the edges of the wafer can be high gas flow at the wafer edge. Spin-coating tools may employ a forced flow of filtered air or another source of clean gas flow to reduce deposition of unwanted particles and/or like contaminates on the spin-coated layer. Depending on the type of material being deposited, such gas flow may additionally or alternatively be used to dissipate noxious fumes. As recognized herein, the gas flow in a typical spin-coating tool tends to be high at the wafer edge, and this can result in reduced spin-on coating thickness proximate to the wafer edge, which in turn can reduce device yield from the edge regions. This is problematic since the edge regions constitute a substantial portion of the total wafer area. Embodiments disclosed herein address this problem by providing a flow field stabilizer comprising an annular wall encircling the wafer edge having pinholes designed to split airflow into sub-flows outboard and inboard, respectively, of the annular wall, so as to utilize Bernoulli's principle to tailor gas flow proximate to the wafer edge in a manner that promotes thickness uniformity in the spin-coated layer.

Figure 1:
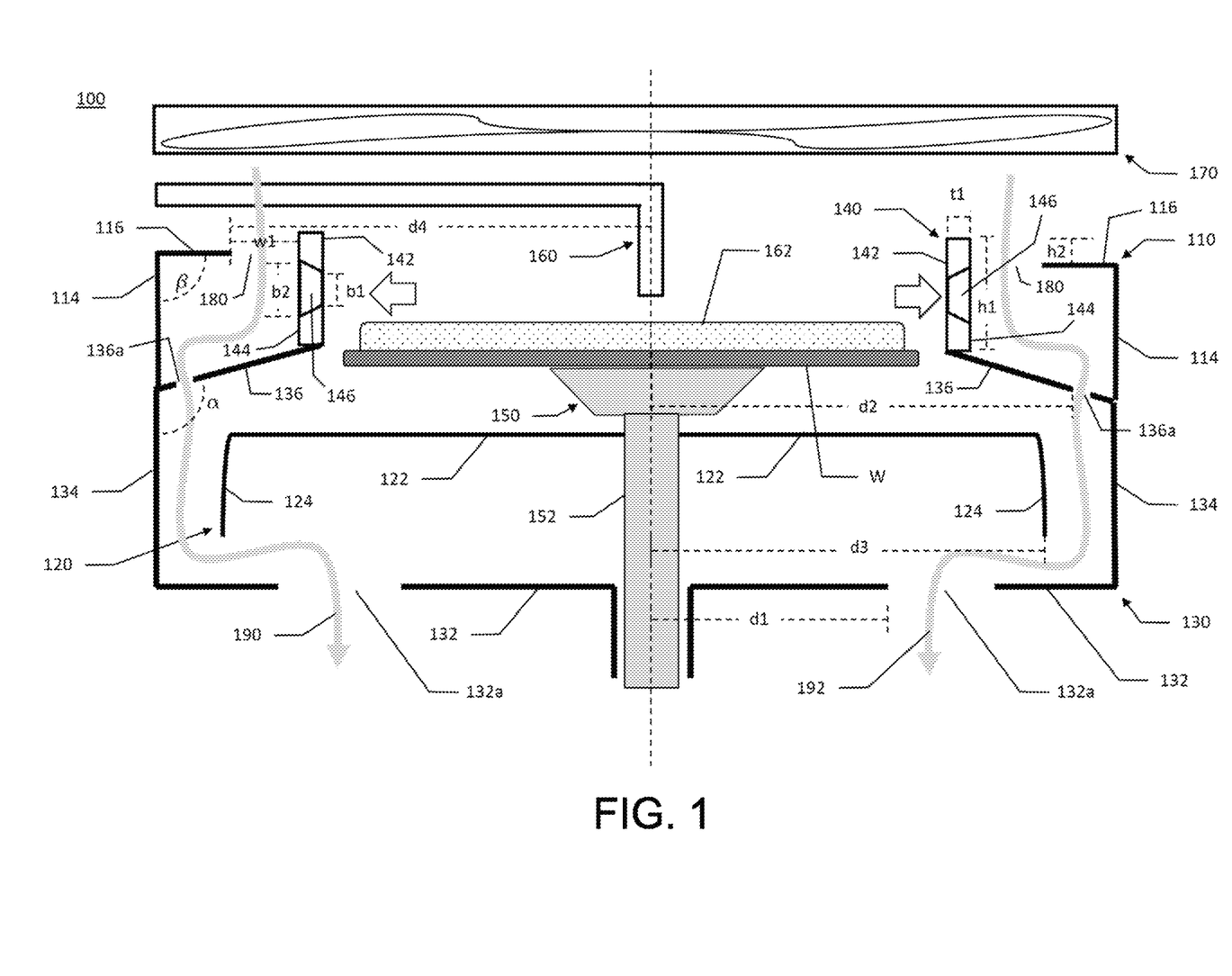
FIG. 1 diagrammatically illustrates a cross-section view of a spin coater for spin coating a layer on a semiconductor wafer in accordance with some embodiments disclosed herein.
Figure 2:
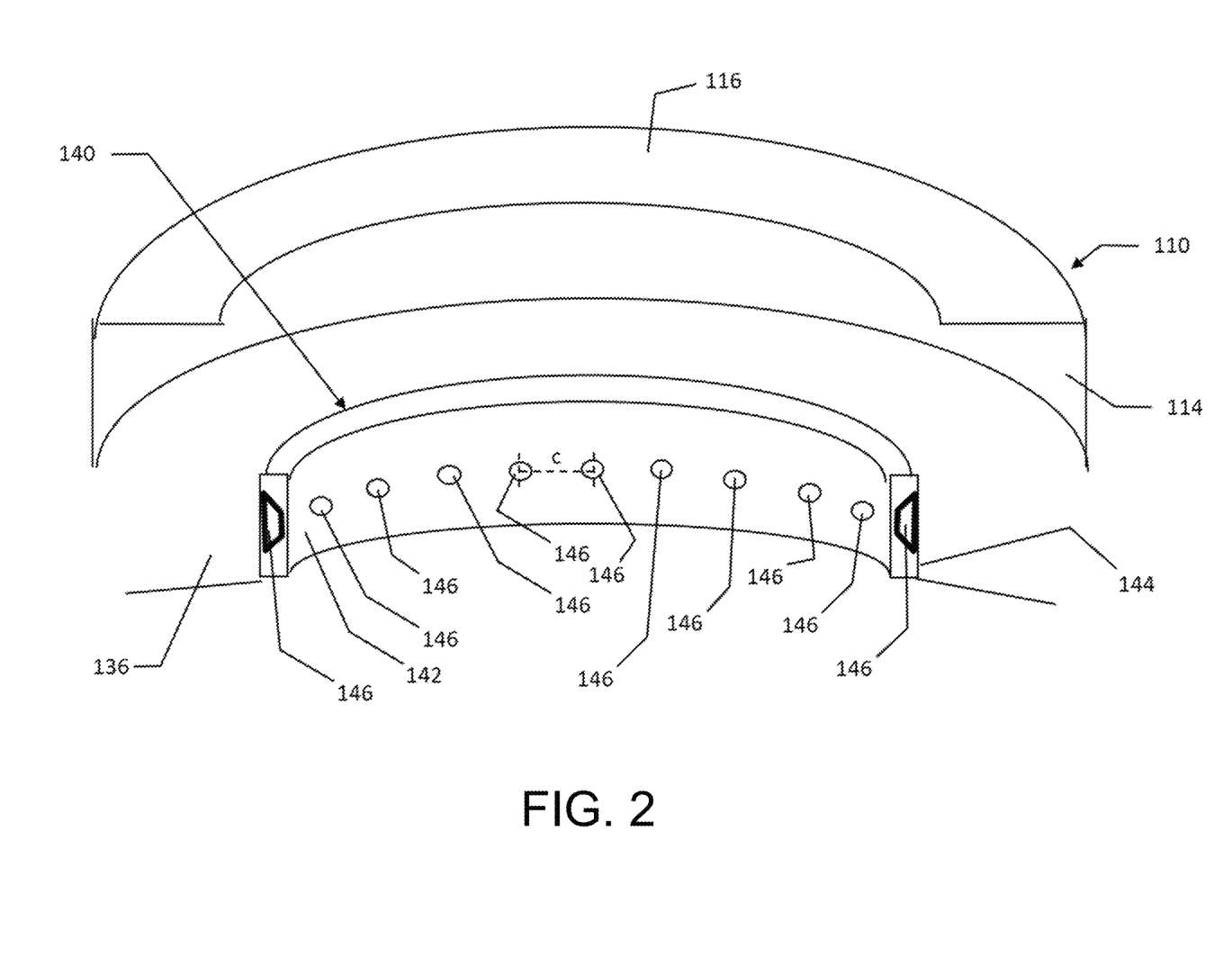
FIG. 2 diagrammatically illustrates a partial exploded perspective view of a spin coater for spin coating a layer on a semiconductor wafer in accordance with some embodiments disclosed herein, wherein portions of selected parts have been cut-away in the view.

FIG. 1 is a diagrammatic illustration showing a cross-section view of a spin-coating tool or spin coater 100 in accordance with aspects of some suitable embodiments disclosed herein. FIG. 2 is a diagrammatic illustration showing an exploded perspective view of selected parts of the spin-coating tool or spin coater 100 in accordance with aspects of some suitable embodiments disclosed herein, wherein portions of the selects part have been cut-away in the view to show various structures. In some embodiments, as shown, the spin coater 100 includes: a top cup 110, a middle cup 120, a bottom cup 130, a flow field stabilizer 140, a rotatable chuck 150, a material depositing nozzle 160, and a gas flow generator 170.

In some embodiments, the rotatable chuck 150 may be a vacuum chuck or an electrostatic chuck or other like chuck suitable for selectively securing thereto and/or holding a semiconductor wafer W on a top thereof. In practice, the rotatable chuck 150 may be selectively rotated and/or spun, for example, about a central vertical axis Z, at a desired speed or revolutions per minute (rpms), along with the semiconductor wafer W secured atop thereof.

In some embodiments, the material depositing nozzle 160, may selectively deposit an initially fluid or flowable coating material, for example, a photoresist material or polyimide material, on a top surface of the semiconductor wafer W held by the rotating chuck 150. In some suitable embodiments, the coating material may be, for example, a polyimide material, such as $C_xH_yN_zO_w$, or another polyimide material or a suitable photoresist material. Suitably, the material depositing nozzle 160 is positioned to initially deposit the coating material on top of the semiconductor wafer W at or near a center or central region of the semiconductor wafer W. When the semiconductor wafer W is spun, for example, in conjunction with the rotation and/or spinning of the rotatable chuck 150 holding the semiconductor wafer W, the deposited flowable coating material is spread and/or flowed, by the centrifugal force, across the top surface of the semiconductor wafer W outward from the central region of the semiconductor wafer W toward an outer periphery or edge of the semiconductor wafer W, thereby forming a spin-coated layer 162 on the semiconductor wafer W. In some suitable embodiments, the initially fluid or flowable coating material used to form the spin-coated layer 162 has a relatively high viscosity. For example, the coating material used to form the spin-coated layer 162 may have a viscosity of greater than 100 centipoise (cP).

One danger that may exist during the spin-coating process is that dust, debris and/or other unwanted particulates may fall or land on the semiconductor wafer W while the spin-coated layer 162 is being formed. Such dust, debris and/or other unwanted particulates falling or landing on the semiconductor wafer W and/or spin-coated layer 162 being formed thereon may result in potential damage or harm to sensitive components of the semiconductor being manufactured and can lead to faults or defects therein. Accordingly, in some suitable embodiments, during the spin-coating process performed with the spin-coater 100, a gas flow is generated by the gas flow generator 170. For example, the gas flow generator 170 may be a fan or the like in some suitable embodiments. In some suitable embodiments, the gas from which the gas flow is generated by the gas flow generator 170 may be substantially clean (for example, substantially free of dust, debris and/or other particulates contaminates) and/or filtered air that is suitably temperature and/or humidity controlled. In some embodiments, another suitable gas or combination of suitable gases may be employed. One advantage of the generated gas flow is that it helps guards against unwanted particles and/or like contaminates from falling or landing on the spin-coated layer 162 being formed and potentially damaging or harming sensitive components of the semiconductor wafer W or otherwise causing faults or defects. The illustrative gas flow generator 170 is a fan forcing gas flow downward onto the top surface of the wafer W. However, the gas flow generator may be otherwise embodied, for example as a fan positioned underneath the wafer W to pull the gas flow, or being embodied as tubing and a hood delivering pressurized gas from a gas bottle, pressurized laboratory gas supply, or the like onto the wafer W, or so forth. The gas flow generator may optionally include a high-efficiency particulate absorbing (HEPA) filter or the like to remove gas-borne particles from the gas flow.

In some suitable embodiments, the top cup 110, the middle cup 120, the bottom cup 130 and the flow field stabilizer 140 cooperate to regulate and/or direct the gas flow generated by the gas flow generator 170. Additionally, the flow field stabilizer 140 and/or arrangement of the foregoing also operate and/or cooperate to regulate and/or direct the gas flow in a manner that advantageously promotes thickness uniformity of the spin-coated layer 162 being formed.

In some suitable embodiments, the bottom cup 130 forms a chamber with the rotatable chuck 150 centered and/or otherwise housed therein. As shown, the bottom cup 130 suitably has: a base or lower floor 132; a side wall 134, for example, that is suitably vertical and cylindrical, and that extends upward from an outer edge or periphery of the base or lower floor 132; and an upper flange or annular lip 136 extending inward, toward the central vertical axis Z, from a top of the side wall 134.

As shown, the base or lower floor 132 of the bottom cup 130 has a central opening through which a shaft 152 of the rotatable chuck 150 passes. In some embodiments, an exhaust port 132a may be formed in the base or lower floor 132 of the bottom cup 130 to allow the generated gas flow to exit the bottom cup 130. In some embodiments, the exhaust port 132a is suitably located or positioned at a radial distance d1 from the central axis Z. Optionally, the exhaust port 132a may comprise an annular gap or other similar opening formed in the base or lower floor 132 of the bottom cup 130. In some suitable embodiments, the exhaust port 132a may comprise one or more individual or distinct openings or the like formed in the base or lower floor 132 of the bottom cup 130.

As shown, the upper flange or annular lip 136 of the bottom cup 130 extends inward toward the central Z axis at an angle α from the side wall 134 of the bottom cup 130. In some suitable embodiments, the angle α is greater than 90 degrees and less than 180 degrees. In some embodiments, an inlet port 136a may be formed in the upper flange or annular lip 136 to allow the generated gas flow to enter the bottom cup 130. In some embodiments, the inlet port 136a is suitably located or positioned at a radial distance d2 from the central axis Z. Suitably, as shown, d2 is greater than d1. Optionally, the inlet port 136a may comprise an annular gap or other similar opening formed in the upper flange or annular lip 136 of the bottom cup 130. In some suitable embodiments, the inlet port 136a may comprise one or more individual or distinct openings or the like formed in the upper flange or annular lip 136 of the bottom cup 130. Suitably, as shown, the inlet port 136a is more proximate or closer to the side wall 134 of the bottom cup 130 than it is to an inner edge or periphery of the upper flange or annular lip 136.

In some suitable embodiments, the middle cup 120 is located and/or housed within the chamber defined by the bottom cup 130. As shown, the middle cup 120 suitably has: a ceiling or upper floor 122; and a side wall 124, for example, that is suitably vertical and cylindrical, and that extends downward from an outer edge or periphery of the ceiling or upper floor 122. As shown, the ceiling or upper floor 122 of the middle cup 120 also has a central opening through which the shaft 152 of the rotatable chuck 150 passes. In some embodiments, the side wall 124 of the middle cup 120 is suitably located or positioned at a radial distance d3 from the central axis Z. Suitably, as shown, d3 is greater than d1 and less than d2.

In practice, the side wall 124 of the middle cup 120 and the side wall 134 of the bottom cup 130 cooperate to form and/or define an annular channel therebetween through which the gas flow is directed. That is to say, the gas flow generated by the gas flow generator 170 enters the bottom cup 130 via the inlet port 136a, then flows between the side wall 122 of the middle cup 120 and the side wall 134 of the bottom cup 130, and then exits the bottom cup 130 via the exhaust port 132a.

In some suitable embodiments, the top cup 110 is located and/or situated above the bottom cup 130. As shown, the top cup 110 suitably has: a side wall 114, for example, that is suitably vertical and cylindrical, and that extends upward from the top end of the side wall 134 of bottom cup 130; and an upper flange or annular lip 116 extending inward, toward the central vertical axis Z, from a top of the side wall 114. As shown, the upper flange or annular lip 116 of the top cup 110 extends inward toward the central axis Z at an angle β from the side wall 114 of the top cup 110. In some suitable embodiments, the angle β is about 90 degrees. Suitably, the upper flange or annular lip 116 of the top cup 110 extends radially inward from the top of the side wall 114 of the top cup 110 by an amount in a range of greater than or equal to about 5 millimeters (mm) and less than or equal to about 95 mm. In some suitable embodiments, the upper flange or annular lip 116 of the top cup 110 extends inward toward the central axis Z beyond the position of the inlet port 136a formed in the upper flange or annular lip 136 of the bottom cup 130. That is to say, a radial distance d4 from the central axis Z to an inner edge or periphery of the upper flange or annular lip 116 is less than d2.

In some suitable embodiments, as shown, the flow field stabilizer 140 is positioned and/or situated at the inner edge of the upper flange or annular lip 136 of the bottom cup 130. The flow field stabilizer 140 suitably takes the form of an annular or cylindrical wall having a first inner surface 142, a second outer surface 144, a thickness t1 and a vertical height h1. In some suitable embodiments, the vertical height h1 of the wall of the flow field stabilizer 140 is in a range of great than or equal to about 5 mm and less than or equal to about 50 mm. In practice, an inner diameter of the flow field stabilizer 140 is, for example, greater than about 300 mm. In some suitable embodiments, the spin coater 100 and/or the various parts or components thereof are suitably dimensioned to receive and/or accommodate a semiconductor wafer W having a diameter of up to about 300 mm. The annular wall of the flow field stabilizer partially encircles the annular edge of the wafer W, and in some embodiments the annular wall of the flow field stabilizer completely encircles the annular edge of the wafer W.

In some suitable embodiments, the wall of the flow field stabilizer 140 is perforated by a plurality of pin holes 146 extending therethrough, for example, in a radial direction from a perspective of the central axis Z. In some suitable embodiments, the plurality of pin holes 146 extend through from the inner surface 142 of the wall to the outer surface 144 of the wall and are spaced, for example, substantially equidistant from one another, about a circumference of the flow field stabilizer 140. In some suitable embodiments, the pin holes 146 are spaced from one another by a distance c of greater than or equal to about 1 mm. These are merely illustrative dimensional ranges, and more generally the size and distribution of the pin holes can be optimized using numerical gas flow modeling or the like to provide the desired control of gas flow over the wafer edge in accordance with Bernoulli's principle to optimize spin-on coating thickness uniformity from wafer center to wafer edge.

Suitably, each pin hole 146 substantially takes the shape of a truncated cone or of a right, oblique or other frustum of a cone or of a pyramid having a polygonal base or the like. In some suitable embodiments, a geometric area defined by each pin hole 146 at the inner surface 142 of the wall of the flow field stabilizer 140 is less than a geometric area defined by the pin hole 146 at the outer surface 144 of the wall of the flow field stabilizer 140. That is to say, the pin holes 146 flare outwardly as they extend from the inner surface 142 to the outer surface 144 of the wall of the flow field stabilizer 140. While the illustrative flaring of the pin holes is linear, in other embodiments the flaring could have some curvature, that is, the pin hole diameter can increase non-linearly from the small diameter at the inner surface 142 to the outer surface 144.

For example, in some suitable embodiments, the pin holes 146 may have a frusto-conical shape where the pin holes 146 have a substantially circular geometric area of diameter b1 at the inner surface 142 of the wall of the flow field stabilizer 146 and a substantially circular geometric area of diameter b2 at the outer surface 144 of the wall of the flow field stabilizer 140, wherein b1 is less than b2. In some suitable embodiments, b1 may be in the range of between greater than or equal to about 1 mm and less than or equal to about 50 mm, while still being less than b2. In some suitable embodiments, b2 may be in the range of between greater than or equal to about 1 mm and less than or equal to about 50 mm, while still being greater than b1. Again, these are merely illustrative dimensional ranges, and more generally the dimensions can be optimized using numerical gas flow modeling or the like.

In some suitable embodiments, the pin holes 146 may take the shape of a frustum of a pyramid having a polygonal base, for example, without limitation, such as a square or rectangular base. For example, in the case of the pin holes 146 having a shape of a frustum of a pyramid with a square base, the pin holes 146 may have a substantially square geometric area of size a1 at the inner surface 142 of the wall of the flow field stabilizer 146 and a substantially square geometric area of size a2 at the outer surface 144 of the wall of the flow field stabilizer 140, wherein a1 is less than a2. Likewise, for example, in the case of the pin holes 146 having a shape of a frustum of a pyramid with a rectangular base, the pin holes 146 may have a substantially rectangular geometric area of size a1 at the inner surface 142 of the wall of the flow field stabilizer 146 and a substantially rectangular geometric area of size a2 at the outer surface 144 of the wall of the flow field stabilizer 140, wherein a1 is less than a2.

In some suitable embodiments, the flow field stabilizer 140 and the top cup 110 are dimensioned and/or arranged such that a gap is defined between the outer surface 144 of the wall of the flow field stabilizer 140 and an inner edge or periphery of the upper flange or annular lip 116 of the top cup 110. In some suitable embodiments, this gap has a width w1, for example, measured along a radial direction with respect to the central axis Z, of greater than or equal to about 5 mm.

In some suitable embodiments, for example, as shown, a top of the wall of the flow field stabilizer 140 rises above and/or extends beyond (that is, in the direction of the Z axis) the upper flange or annular lip 116 of the top cup 110. For example, the top of the wall of the flow field stabilizer 140 suitably rises above and or extends beyond the upper flange or annular lip 116 of the top cup 110 by a distance h2 measured in the direction of the Z axis, where h2 is in a range of greater than or equal to about 5 mm and less than or equal to about 50 mm.

As shown, the flow field stabilizer 140 and the upper flange or annular lip 116 of the top cup 110 cooperate to form and/or define an annular gap 180 therebetween through which the gas flow is directed. That is to say, the gas flow generated by the gas flow generator 170 enters the top cup 110 via the aforementioned gap 180, then flows out of the top cup 110 and into the bottom cup 130 via the inlet port 136a formed in the upper flange or annular lip 136 of the bottom cup 130, then flows between the side wall 122 of the middle cup 120 and the side wall 134 of the bottom cup 130, and then exits the bottom cup 130 via the exhaust port 132a.

In some suitable embodiments, a majority of the gas flow (which is graphically represented by arrows 190 and 192 in FIG. 1) generated by the gas flow generator 170 is directed through the gap 180. For example, in a range of greater than about 50% and less than or equal to about 90% of the gas flow generated by the gas flow generator 170 is directed through the gap 180.

Suitably, in practice, the flow field stabilizer 140 and/or pin holes 146 formed therein operate under and/or employ Bernoulli's principle to control gas flow over the wafer edges to help promote thickness uniformity in the spin-coated layer 162 being formed. More specifically, the relatively large gas flow through the gap 180 and past the pin holes 146 on the outer surface 144 side of the wall of the flow field stabilizer 140 tends to generate small, localized vacuums or relatively lower air pressure regions on the outer surface 144 side of the pin holes 146 as compared to the inner surface 142 side of the pin holes 146. The resulting differential in air pressure in turn tends to create an outward lateral or radial (i.e., from the perspective of the central axis Z) draw, pressure differential and/or air flow (or, more generally, gas flow) through the pin holes 146. This outward lateral or radial draw, pressure differential and/or air flow being proximate and/or near the outer edge and/or periphery of the semiconductor wafer W on which the layer 162 is being spin-coated tends to promote thickness uniformity, for example, by increasing the draw, flow and/or spreading of the coating material toward the outer edge or periphery of the semiconductor wafer W thereby guarding against the spin-coated layer 162 having a relatively thinner dimension near the outer edge or periphery of the semiconductor wafer W, for example, as compared to the more central region of the semiconductor wafer W, where the coating material is initially deposited.

Figure 3:
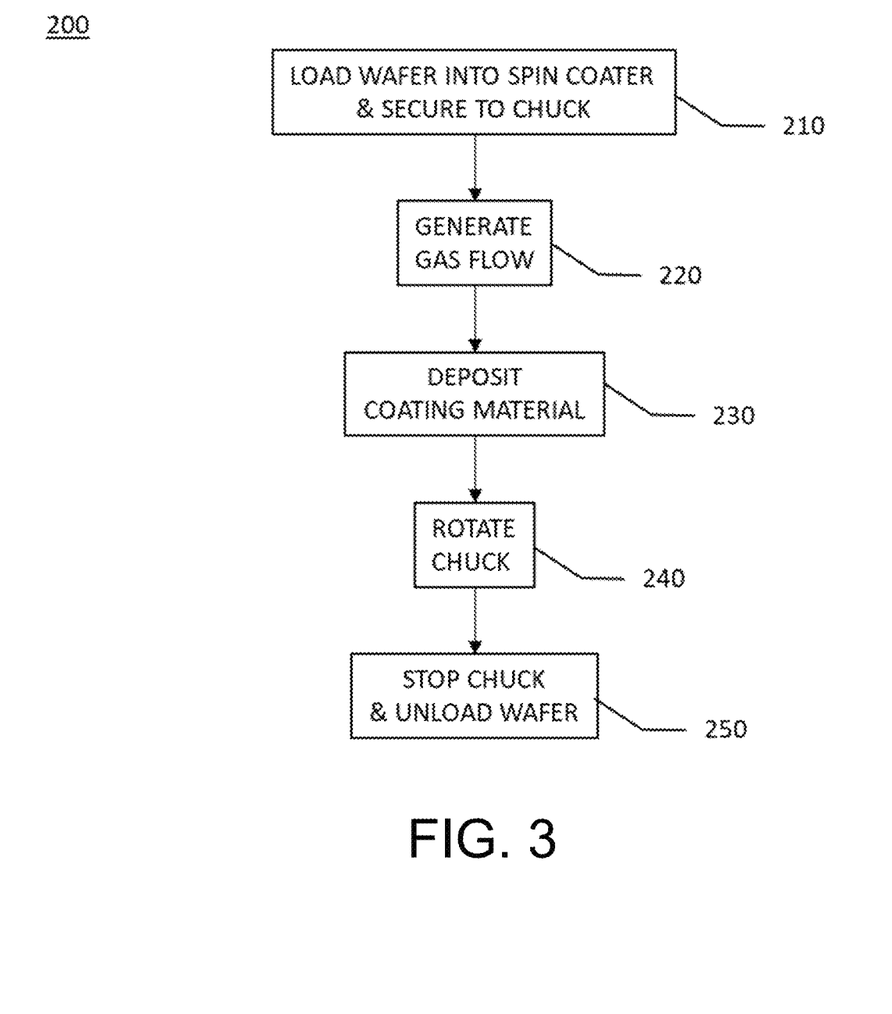
FIG. 3 is a flow chart showing a method and/or process for spin coating a layer on a semiconductor wafer in accordance with some embodiments disclosed herein.

FIG. 3 shows a flow chart illustrating an exemplary method and/or process 200 for spin-coating a layer (for example, such as layer 162) on a semiconductor wafer (for example, such as the semiconductor wafer W). In one suitable embodiment, the method or process 200 may be carried out using the spin-coating tool or spin coater 100 previously described with reference to FIGS. 1 and 2.

As shown in FIG. 3, the spin-coating method or process 200 begins with step 210, where the semiconductor wafer W is loaded in the spin coater 100. In practice, this loading step 210 suitably includes securing to the semiconductor wafer W to the rotatable chuck 150.

At step 220, a gas flow may be initiated, created and/or otherwise generated, for example, by the gas flow generator 170. In some suitable embodiments, as previously discussed, a majority (for example, greater than 50% and less than or equal to 90%) of the generated gas flow is directed through the gap 180 and past the pin holes 146 along the outer surface 144 of the wall of the flow field stabilizer 140, thereby, in accordance with Bernoulli's principle, creating a pressure differential between the side of the pin holes 146 at the inner surface 142 of the wall of the flow field stabilizer 140 and the side of the pin holes 146 at the outer surface 144 of the wall of the flow field stabilizer 140.

At step 230, a portion of fluid or flowable coating material, from which the layer 162 is being formed, is deposited, for example, by the material depositing nozzle 160, on the loaded semiconductor wafer W, at or near a center or central region of the semiconductor wafer W. In some suitable embodiments, the semiconductor wafer W may be substantially stationary during the initial depositing of the coating material. In some suitable embodiments, while the coating material is being initially deposited, the semiconductor wafer W may already be spinning, for example, in conjunction with rotation of the rotatable chuck 150, albeit at relatively low rpms. Once a desired portion of the coating material has been deposited, the material depositing nozzle 160 ceases or quits depositing further material.

At step 240, the semiconductor wafer W, with the deposited coating material there atop, is spun, for example, about the central axis Z, by suitable rotation of the rotatable chuck 150 to which the semiconductor wafer W is secured. In some suitable embodiments, the semiconductor wafer W is spun at relatively greater rpms than it may have been spinning at the time the coating material was initially deposited. Accordingly, the centrifugal force generated by the spinning of the semiconductor wafer W causes the deposited coating material to spread and/or flow across a top surface of the semiconductor wafer W toward the outer edge or periphery of the semiconductor wafer W. In a variant embodiment, the chuck rotation step 240 may be initiated prior to depositing the coating material in the step 230, so that the wafer is spinning at the target rpm rate before the deposition step 230 starts.

Notably, the flow field stabilizer 140 (for example, in conjunction with the gas flow generated by the gas flow generator 170) produces at the pin holes 146 an outward latter or radial (i.e., from the perspective of the central axis Z) draw, pressure differential and/or air flow (or, more generally, gas flow) through the pin holes 146. This outward latter or radial draw, pressure differential and/or air flow being proximate and/or near the outer edge and/or periphery of the semiconductor wafer W on which the layer 162 is being spin-coated tends to promote thickness uniformity, for example, by increasing the draw, flow and/or spreading of the coating material toward the outer edge or periphery of the semiconductor wafer W thereby guarding against the spin-coated layer 162 having a relatively thinner dimension near the outer edge or periphery of the semiconductor wafer W, for example, as compared to the more central region of the semiconductor wafer W, where the coating material is initially deposited.

At step 250, upon achieving a desired thickness of the spin-coated layer 162, spinning of the semiconductor wafer W is ceased, for example, by stopping the rotation of the rotatable chuck 150, and after any optional additional drying time has passed, the semiconductor wafer W with the spin-coated layer 162 formed thereon may be removed from the rotatable chuck 150 and/or otherwise unloaded from the spin coater 100. More generally, the rpm rate and spin time may be optimized in calibration runs to achieve optimal thickness uniformity with the flow field stabilizer 140.

Figure 4:
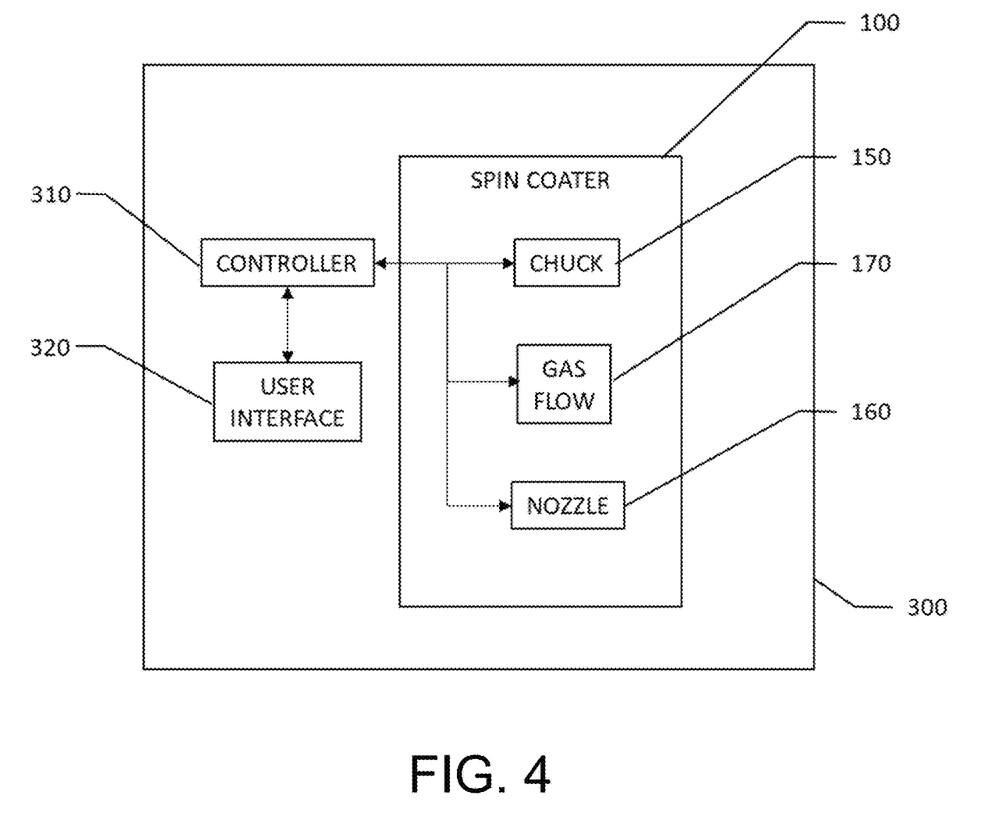
FIG. 4 diagrammatically illustrates a spin coating apparatus for spin coating a layer on a semiconductor wafer in accordance with some embodiments disclosed herein.

FIG. 4 is a diagrammatic illustration showing a system or spin-coating apparatus 300, for example, including the spin coater 100. As shown, the apparatus includes a controller or processor 310 that regulates and/or controls the various parts and/or components of the spin coater 100. For example, without limitation, the controller or processor 310, may: selectively engage or disengage the rotatable chuck 150 to selectively hold or release a semiconductor wafer W placed thereon; selectively rotate or stop the rotatable chuck 150 and/or regulate the rpms at which the rotatable chuck 150 is spun; selectively turn on and/or stop the gas flow generator 170 and/or regulate the amount and/or velocity of the gas flow generated thereby; and selectively regulate the material deposition nozzle 160 to output and/or cease output of coating material therefrom. In some suitable embodiments, the controller or processor 310 is programmed or otherwise provisioned to cause the spin coater 100 to automatically carry out the spin-coating method or process 200. In some suitable embodiments, various parameters for executing the spin-coating method or process 200, for example, without limitation, the amount of coating material to initially deposit, the rpms at which the rotatable chuck 150 is to be spun at various time, the designation of an optional drying time, when various part or components of the spin coater 100 are to be turned on or engaged and/or turned off or disengaged, etc., may be pre-programmed or otherwise provided to the controller or processor 310. In some suitable embodiments, the spin coating apparatus 300 also includes a user interface 320, including one or more input and/or output devices, for example, such as a keypad, display, etc., which a user may selectively employ to program and/or control operation of the spin coater 100 and receive information about the operational state of the spin coater 100 and/or the respective parts and/or components thereof.

In some embodiments, the controller or processor 310 may be implemented via hardware in combination with software or firmware or a combination thereof. In particular, one or more controllers may be embodied by processors, electrical circuits, computers and/or other electronic data processing devices that are configured and/or otherwise provisioned to perform one or more of the tasks, steps, processes, methods and/or functions described herein. For example, a microprocessor, microcontroller, computer, server or other electronic data processing device embodying a controller may be provided, supplied and/or programmed with a suitable listing of code (e.g., such as source code, interpretive code, object code, directly executable code, and so forth) or other like instructions or software or firmware, such that when run and/or executed by the computer or other electronic data processing device one or more of the tasks, steps, processes, methods and/or functions described herein are completed or otherwise performed. Suitably, the listing of code or other like instructions or software or firmware is implemented as and/or recorded, stored, contained or included in and/or on a non-transitory computer and/or machine readable storage medium or media so as to be providable to and/or executable by the computer or other electronic data processing device. For example, suitable storage mediums and/or media can include but are not limited to: floppy disks, flexible disks, hard disks, magnetic tape, or any other magnetic storage medium or media, CD-ROM, DVD, optical disks, or any other optical medium or media, a RAM, a ROM, a PROM, an EPROM, a FLASH-EPROM, or other memory or chip or cartridge, or any other tangible medium or media from which a computer or machine or electronic data processing device can read and use. In essence, as used herein, non-transitory computer-readable and/or machine-readable mediums and/or media comprise all computer-readable and/or machine-readable mediums and/or media except for a transitory, propagating signal.

In general, any one or more of the particular tasks, steps, processes, methods, functions, elements and/or components described herein may be implemented on and/or embodiment in one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. In general, any device, capable of implementing a finite state machine that is in turn capable of implementing the respective tasks, steps, processes, methods and/or functions described herein can be used.

In the following, some further illustrative embodiments are described.

In some embodiments, a method is provided for forming a layer on a semiconductor wafer having a central region and an outer edge. The method includes: depositing a coating material on the semiconductor wafer at the central region, the layer being formed from the coating material; rotating the semiconductor wafer about an axis such that a centrifugal force urges the coating material to spread from the central region toward the outer edge of the semiconductor wafer; and creating a pressure differential in one or more regions proximate to the outer edge of the semiconductor wafer.

In some further embodiments, creating the pressure differential includes: flowing a gas past one or more pins holes extending through a wall proximate to and at least partially encircling the outer edge of the semiconductor wafer, the wall having an inner surface facing the outer edge of the semiconductor wafer and an outer surface opposite the inner surface, and each pin hole defining an inner opening at the inner surface of the wall and an outer opening at the outer surface of the wall.

In still additional embodiments, the inner opening defined by each pin hole has a first geometric area and the outer opening defined by each pin hole has a second geometric area, the second geometric area being greater than the first geometric area.

In some embodiments, each pin hole has a shape of a frustrum of one of a cone or a pyramid.

In yet further embodiments, flowing the gas comprises flowing the gas alongside the outer surface of the wall.

In some further embodiments, the pressure differential includes relatively lower pressure regions at the outer openings of the pin holes as compared to the inner openings of the pin holes.

In some embodiments, the pressure differential draws the coating material toward the outer edge of the semiconductor wafer.

In yet further embodiments, the coating material has a viscosity of greater than or equal to 100 cP.

In some embodiments, the coating material is one of a photoresist or polyimide material.

In some further embodiments, a spin coater is provided for forming a layer on a semiconductor wafer having a central region and an outer edge. The spin coater includes: a rotatable chuck configured to hold the semiconductor wafer; and a nozzle arranged to selectively deposit a coating material at the central region of the semiconductor wafer held on the rotatable chuck, the coating material forming the layer. The semiconductor wafer is spun about an axis by rotation of the rotatable chuck and a centrifugal force is created that urges the coating material to spread from the central region toward the outer edge of the semiconductor wafer. The spin coater further includes a flow field stabilizer having: an annular wall arranged such that, when the semiconductor wafer is secured to the rotatable chuck, the annular wall is proximate to and encircles the outer edge of the semiconductor wafer, the annular wall having an inner surface which faces the outer edge of the semiconductor wafer and an outer surface opposite the inner surface; and one or more pins holes extending through said annular wall from the inner surface to the outer surface, each pin hole defining an inner opening at the inner surface of the annular wall and an outer opening at the outer surface of the annular wall. The spin coater also includes a gas flow generator that produces a flow of gas, at least a portion of said flow of gas being directed to run along an outside of the outer surface of the wall of the flow field stabilizer and past the outer openings of said pin holes.

In still further embodiments, the inner opening defined by each pin hole has a first geometric area and the outer opening defined by each pin hole has a second geometric area, the second geometric area being greater than the first geometric area.

In yet additional embodiments, each pin hole has a shape of a frustrum of one of a cone or a pyramid.

In some further embodiments, the portion of the flow of gas running along the outside of the outer surface of the wall of the flow field stabilizer and past the outer openings of the pin holes creates localized pressure differentials including relatively lower pressure regions at the outer openings of the pin holes as compared to the inner openings of the pin holes.

In some additional embodiments, the localized pressure differentials operate to draw the coating material toward the outer edge of the semiconductor wafer.

In some embodiments, the spin coater further includes a top cup having an annular lip extending inward toward the axis, said annular lip and the outer surface of the wall of the flow field stabilizer defining an annular gap therebetween through which the portion of the flow of gas is directed.

In some embodiments, the annular gap has a width of greater than or equal to 5 mm as measured in a radial direction with respect to the axis.

In some further embodiments, the portion of the flow of gas directed through the annular gap is in a range of greater than 50 percent of the flow of gas and less than or equal to 90 percent of the flow of gas.

In still further embodiments, a spin coating apparatus is provided for forming a layer on a semiconductor wafer. The spin coating apparatus includes: a depositor that selectively deposits a coating material on the semiconductor wafer; a chuck which holds the semiconductor wafer such that the semiconductor wafer is spun in conjunction with rotation of the chuck thereby spreading the coating material toward an outer edge of the semiconductor wafer; a wall which is proximate to and at least partially encircles the outer edge of the semiconductor wafer; and one or more pins holes extending through the wall, each pin hole defining an inner opening at an inner surface of the wall and an outer opening at an outer surface of the wall. Suitably, localized pressure differentials are created across the pin holes by flowing a gas alongside the outer surface of the wall and past the outer openings of the pin holes, the localized pressure differentials acting to draw the coating material toward the outer edge of the semiconductor wafer.

In yet further embodiments, the spin coating apparatus further includes: a controller which regulates operation of at least one of the depositor and the chuck; and a user interface selectively employable by a user to input instructions to the controller so that the controller regulates the operation of at least one of the depositor and the chuck in accordance with the instructions.

In still one more embodiment, the spin coating apparatus further includes: a gas flow generator for creating a gas flow alongside the outer surface of the wall and past the outer openings of the pin holes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a layer on a semiconductor wafer having a central region and an outer edge, said method comprising:
    depositing a coating material on the semiconductor wafer at the central region, said layer being formed from the coating material;
    rotating said semiconductor wafer about an axis such that a centrifugal force urges the coating material to spread from the central region toward the outer edge of the semiconductor wafer; and
    creating localized pressure differentials across pin holes extending through an annular wall which is proximate to and at least partially encircles the outer edge of the semiconductor wafer by flowing a gas alongside an outer surface of the annular wall and past outer openings of the pin holes to create relatively lower air pressure regions proximate to the outer edge of the semiconductor wafer compared to the central region of the semiconductor wafer.

2. The method of claim 1, wherein:
    each pin hole defines an inner opening at an inner surface of the annular wall and the outer opening at an outer surface of the annular wall.

3. The method of claim 2, wherein:
    the inner opening defined by each pin hole has a first geometric area and the outer opening defined by each pin hole has a second geometric area, the second geometric area being greater than the first geometric area.

4. The method of claim 3, wherein each pin hole has a shape of a frustrum of one of a cone or a pyramid.

5. The method of claim 1, wherein the gas is air.

6. The method of claim 5, wherein the flowing of the air is generated by a fan.

7. The method of claim 1, wherein the localized pressure differentials draw the coating material toward the outer edge of the semiconductor wafer.

8. The method of claim 1, wherein the coating material has a viscosity of greater than or equal to 100 cP.

9. The method of claim 1, wherein the coating material is one of a photoresist or polyimide material.

10. A method for forming a layer on a semiconductor wafer having a central region and an outer edge, the method comprising:
    securing the semiconductor wafer on a rotatable chuck of a spin coater, the spin coater further comprising a flow field stabilizer including an annular wall arranged proximate to and encircling the outer edge of the semiconductor wafer secured to the rotatable chuck with an inner surface of the annular wall facing the outer edge of the semiconductor wafer and an outer surface of the annular wall opposite the inner surface, and one or more pin holes extending through the annular wall from the inner surface to the outer surface, each pin hole defining an inner opening at the inner surface of the annular wall and an outer opening at the outer surface of the annular wall;
    using a nozzle, depositing a coating material at the central region of the semiconductor wafer held on the rotating chuck, the coating material forming the layer;

spinning the semiconductor wafer about an axis by rotation of the rotatable chuck, the spinning creating a centrifugal force that urges the coating material to spread from the central region toward the outer edge of the semiconductor wafer; and flowing a gas along an outside of the outer surface of the wall of the flow field stabilizer and past the outer openings of the one or more pin holes, the flow of the gas creating a pressure differential in one or more regions proximate to the outer edge of the semiconductor wafer;

wherein the spin coater further includes a top cup having an annular lip extending inward toward the axis, the annular lip and the outer surface of the wall of the flow field stabilizer defining an annular gap therebetween through which a portion of the flow of the gas is directed.

11. The method of claim 10, wherein:
the inner opening defined by each pin hole has a first geometric area and the outer opening defined by each pin hole has a second geometric area, the second geometric area being greater than the first geometric area.

12. The method of claim 11, wherein each pin hole has a shape of a frustrum of one of a cone or a pyramid.

13. The method of claim 10, wherein the flow of the gas along the outside of the outer surface of the wall of the flow field stabilizer and past the outer openings of the pin holes creates the pressure differential comprising localized pressure differentials including relatively lower pressure regions at the outer openings of the pin holes as compared to the inner openings of the pin holes.

14. The method of claim 13, wherein the localized pressure differentials draw the coating material toward the outer edge of the semiconductor wafer.

15. The method of claim 10, wherein the annular gap has a width of greater than or equal to 5 mm as measured in a radial direction with respect to the axis.

16. The method of claim 15, wherein the portion of the flow of the gas directed through the annular gap is in a range of greater than 50 percent of the flow of the gas and less than or equal to 90 percent of the flow of the gas.

17. A method for forming a layer on a semiconductor wafer, the method comprising:
depositing a coating material on the semiconductor wafer;
spinning the semiconductor wafer by rotating a chuck which holds the semiconductor wafer, the spinning causing the coating material to spread toward an outer edge of the semiconductor wafer; and
creating localized pressure differentials across pin holes extending through an annular wall which is proximate to and at least partially encircles the outer edge of the semiconductor wafer held by the chuck by flowing a gas alongside an outer surface of the annular wall and past outer openings of the pin holes to create relatively lower air pressure regions on the outer surface of the annular wall, the localized pressure differentials drawing the coating material toward the outer edge of the semiconductor wafer.

18. The method of claim 17, wherein the gas is air.

19. The method of claim 17, wherein the coating material is one of a photoresist or polyimide material.

20. The method of claim 17, wherein a top cup surrounds the annular wall, the top cup having an annular lip extending inward toward the annular wall, the annular lip and the outer surface of the annular wall defining an annular gap therebetween through which a portion of the flow of the gas is directed.

* * * * *